United States Patent [19]

Easley et al.

[11] Patent Number: 5,267,190
[45] Date of Patent: Nov. 30, 1993

[54] SIMULTANEOUS SEARCH-WRITE CONTENT ADDRESSABLE MEMORY

[75] Inventors: Jeffery L. Easley, Carlsbad, Calif.; Ronald M. Christiansen, Richfield, Minn.; David C. Lee, San Diego, Calif.; Ashgar K. Malik, Escondido, Calif.; John F. Agrusa, Mission Viejo, Calif.

[73] Assignee: Unisys Corporation, Blue Bell, Pa.

[21] Appl. No.: 24,329

[22] Filed: Apr. 28, 1993

Related U.S. Application Data

[63] Continuation of Ser. No. 667,704, Mar. 11, 1991, abandoned.

[51] Int. Cl.⁵ .............................................. G11C 15/00
[52] U.S. Cl. ...................................... 365/49; 365/154; 365/233
[58] Field of Search ........................ 365/49, 154, 233

[56] References Cited

U.S. PATENT DOCUMENTS

| | | | |
|---|---|---|---|
| 3,969,707 | 7/1976 | Lane et al. | 340/173 |
| 4,532,606 | 7/1985 | Phelps | 365/49 |
| 4,758,983 | 7/1988 | Berndt | 365/49 |
| 4,794,559 | 12/1988 | Greenberger | 365/49 |
| 4,852,059 | 7/1989 | Oates | 365/49 |
| 4,894,799 | 1/1990 | Hanawa et al. | 365/49 |
| 5,051,949 | 9/1991 | Young | 365/49 |

Primary Examiner—William L. Sikes
Assistant Examiner—Terry D. Cunningham
Attorney, Agent, or Firm—Charles J. Fassbender; Mark T. Starr

[57] ABSTRACT

An improved content addressable memory includes a control circuit which, during a single clock pulse, receives and compares one search address on search address input terminals to compare addresses in N address registers, and simultaneously the control circuit conditionally writes a previously received search address into a selectable one of N address registers. With this improvement, the operating speed of the content addressable memory is increased since the writing of one search address into an address register and the searching with another search address does not require two separate clock cycles.

8 Claims, 4 Drawing Sheets

SIMULTANEOUS SEARCH-WRITE CONTENT ADDRESSABLE MEMORY

This is a continuation of copending application Ser. No. 07/667,704, filed Mar. 11, 1991, now abandoned.

BACKGROUND OF THE INVENTION

This invention relates to content addressable memories (CAM's); and more particularly, it relates to the overall architecture and functional capabilities of such memories.

By a content addressable memory is meant an electronic module which contains: 1) a plurality of address registers, each of which holds a word of data herein called a compare address; 2) a write circuit which selectively loads the compare addresses into the address registers; 3) input terminals for receiving sequences of other data words herein called search addresses; and 4) respective compare circuits which are coupled to each of the address registers and the search address input terminals. In operation, the content addressable memory compares each search address via the compare circuits to the compare addresses in all of the address registers. If a search address equals a compare address in one of the address registers, then a MATCH signal is generated that indicates which of the address registers caused the match.

This MATCH signal is then utilized to perform some higher level operation. For example, the content addressable memory can comprise a portion of a data cache in which the MATCH signal is used to read data stored in the cache. If no MATCH signal occurs when the search address is sent to the content addressable memory, then the content addressable memory and the cache are updated via a write operation. These compare and write operations are cyclicly performed in synchronization with a clock.

In the prior art, various references teach and describe transistor circuits by which the content addressable memory can be implemented. For example, see an article entitled "Design, Selection and Implementation of a Content Addressable Memory for a VLSI CMOS Chip Architecture" by S. Jones in the IEE Proceedings, Volume 135, Pt. E, No. 3, May 1988, pages 165–172. There, the circuit design and characteristics of four different content addressable memories, labelled CAM A thru CAM D, are disclosed and compared in terms of speed, power dissipation, and chip space.

Despite such prior art, the present inventors have discovered a new overall architecture for the content addressable memory by which its speed of performing the search and write operations is substantially improved. As a result, any higher level function in which the CAM performs a role is also similarly improved.

BRIEF SUMMARY

The present invention is an improvement over a conventional content addressable memory of the type which includes search address input terminals for sequentially receiving search addresses in synchronization with clock pulses; a plurality of address registers, each of which stores a compare address; and compare circuits, respectively coupled to each of the address registers and to the search address input terminals, that generate match signals which indicate when a search address is the same as a compare address in the address registers. In accordance with the present invention, the improvement comprises a control circuit, which during a single clock pulse, receives and compares one search address on the address input terminals to the compare addresses in the address registers, and simultaneously, conditionally writes a previously received search address into a selectable one of the address registers. With this improvement, the operating speed of the content addressable memory is increased since the writing of one search address into an address register and the searching with another search address does not require two separate clock pulses—as is the case in the prior art.

BRIEF DESCRIPTION OF THE DRAWINGS

A preferred embodiment of the invention, as well as its various features and advantages, are described herein in conjunction with the accompanying drawings wherein.

DETAILED DESCRIPTION

Figure 1:
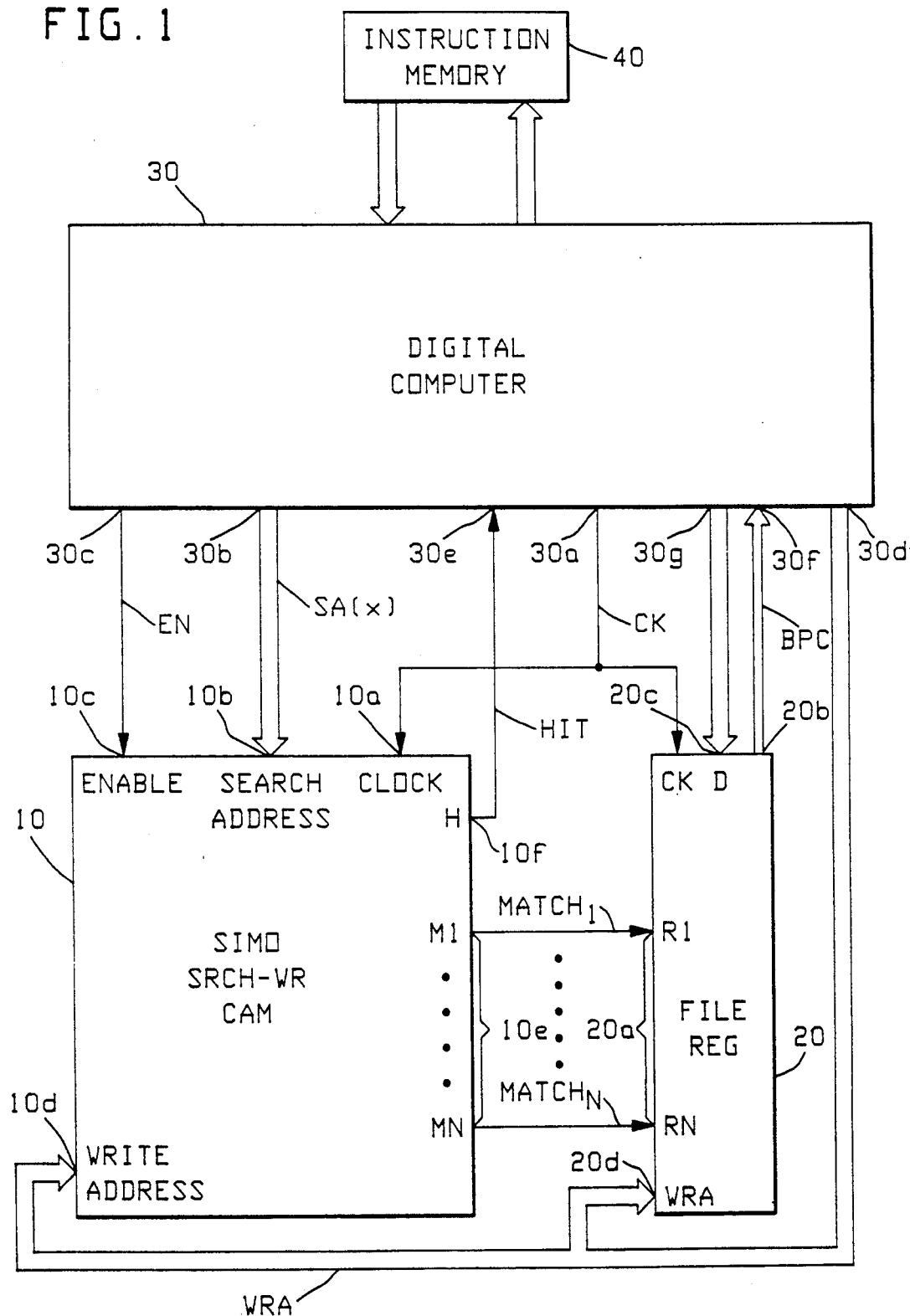
FIG. 1 shows a computer system which performs a branch prediction function with the aid of a content addressable memory that is constructed in accordance with the invention.

Referring now to FIG. 1, it shows a block diagram of a content addressable memory 10 which is constructed according to the invention; and it also shows a file register 20, a digital computer 30, and an instruction memory 40 with which the content addressable memory 10 operates to perform a branch prediction function. File register 20, computer 30, and instruction memory 40 are intercoupled to the content addressable memory 10 as shown.

Reference numerals 10a, 10b, 10c and 10d indicate the input terminals to the content addressable memory 10. One input terminal 10a receives a clock signal CK which is generated from an output terminal 30a of computer 30. A group of input terminals 10b receives search addresses SA(x), where x = 1, 2, . . . , in synchronization with the clock signal CK. Each search address SA(x) is sent from a group of output terminals 30b on computer 30. Input terminal 10c receives an enable signal EN which is generated from an output terminal 30c on computer 30. And, a group of input terminals 10d receive write address signals WRA which are sent from a group of output terminals 30d on computer 30.

Reference numerals 10e and 10f indicate the output terminals of the content addressable memory 10. One group of "N" output terminals 10e send respective signals which are labelled MATCH$_1$ thru MATCH$_N$. Internally within the content addressable memory 10 are "N" address registers which store respective compare addresses, and each MATCH signal indicates when the search address SA(x) is the same as the compare address in a corresponding one of those address registers. Also, when any one of the MATCH signals goes true, the content addressable memory 10 sends a HIT signal from output terminal 10f to an input terminal 30e of computer 30.

All of the MATCH signals are sent to respective input terminals 20a on the register file 20. There, the MATCH signal reads the content of one register in the register file; the MATCH2 signal reads the content of another register in the register file; etc. Data from the register that is read in file 20 is sent from output terminals 20b to a group of input terminals 30f on computer 30.

To perform the branch prediction function, computer 30 utilizes the content addressable memory 10 and the register file 20 as follows. Initially, the "N" address registers which are internal to the content addressable 10 are loaded with the addresses of "N" conditional branch instructions that are present in the instruction memory 40; and, corresponding registers in the register file 20 are loaded with branch prediction codes BPC that indicate which way those "N" instructions are most likely to branch. These branch prediction codes are sent from a group of output terminals 30g on computer 30 to a group of input terminals 20c on the register file; and, the particular register into which a code is written is selected by the write address signals WRA that are sent from computer 10 to a group of input terminals 20d on the register file 20.

As an example of the above, suppose that one particular conditional branch instruction is in the instruction memory 40 at an address Al; and suppose that when such instruction is executed, the condition on which it branches is usually true. In that case, computer 30 stores the address Al in one of the "N" address registers of the content addressable memory 10, and it stores a branch prediction code in a corresponding register of the register file 20 indicating that the branch condition is likely to be true. Conversely, if the conditional branch instruction at address Al usually finds that its branch condition is false, then computer 30 stores a different code in the register file 20.

Thereafter, each time computer 10 fetches an instruction for execution from the instruction memory 40, it simultaneously sends the address of that instruction from its output terminals 30b to the content addressable memory 10 as a search address SA(x). At the same time, computer 30 sets the enable signal EN true if the search address is of a conditional branch instruction. In response, the content addressable memory 10 initiates a search operation. If this search results in one of the MATCH signals going true, then the corresponding branch prediction code BPC is read from register file 20 and sent to computer 30. Then, computer 30 utilizes the branch predict code to determine which instruction to fetch next from the instruction memory 40.

Recall, however, that the content addressable memory 10 does not store the addresses of every conditional branch instruction that is in the instruction memory 40; it only stores the address of "N" such instructions. Thus from time to time, computer 10 will initiate a search by the content addressable memory 10; and in that search, all of the MATCH signals go false. When that occurs, one of the "N" address registers in the content addressable memory 10 needs to be written with the new branch instruction address, and a branch prediction code for that instruction needs to be written into the register file.

A primary novel feature of the content addressable memory is the time sequence by which it performs the above described search and write operations. This sequence is illustrated in the timing diagram of FIG. 2. There, the topmost signal waveform shows four successive cycles of the clock signal CK. Clock pulse P(1) defines the first cycle; and clock pulses P(2), P(3), and P(4) respectively define the second, third, and fourth clock cycles.

Figure 2:
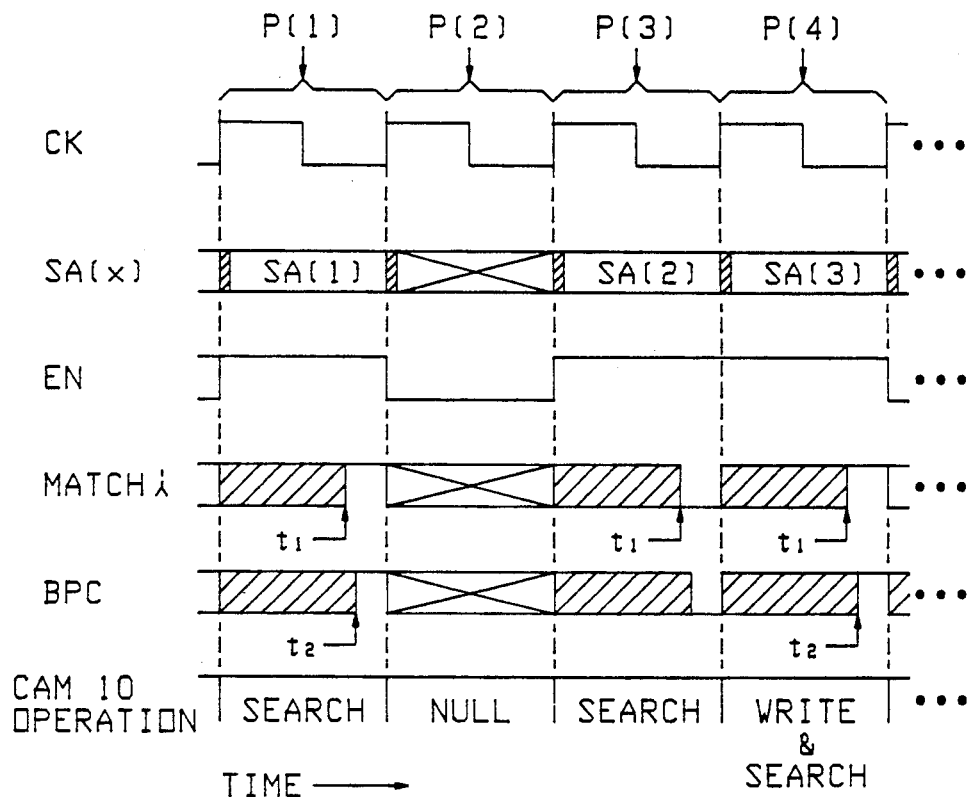
FIG. 2 is a timing diagram which shows the sequence of operation for the content addressable memory in the FIG. 1 system.
Figure 3:
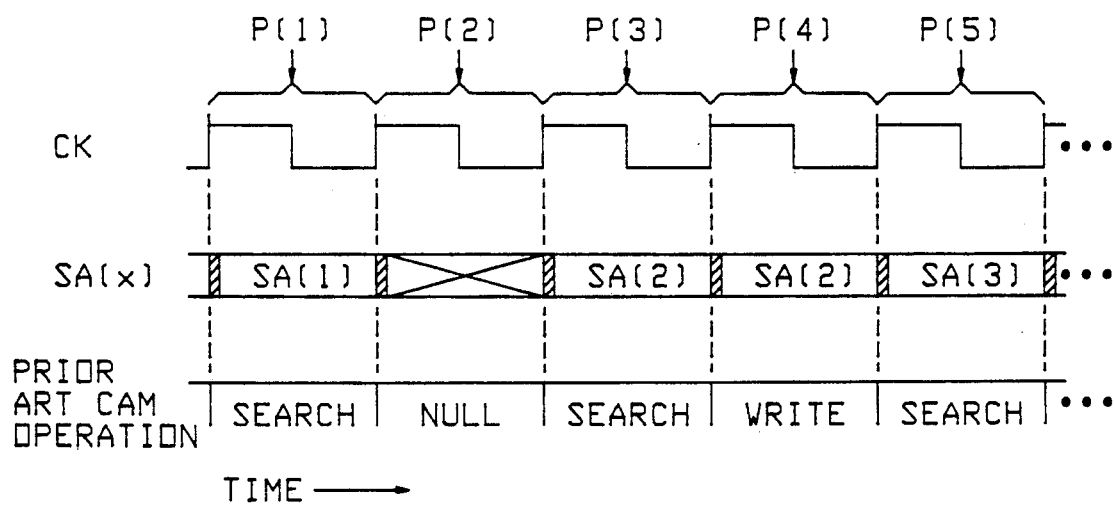
FIG. 3 is a timing diagram which illustrates how the FIG. 1 system would operate in a slower fashion if it incorporated a content addressable memory of the prior art.

At the start of clock pulse P(1), computer 30 raises the enable signal EN and sends a search address SA(1) to the input terminals 10b of the content addressable memory 10. This search address SA(1) is the address of a conditional branch instruction in the instruction memory 40 which computer 30 is going to execute. In response, the content addressable memory performs a search operation; and, the result of that search is indicated by the MATCH signals. In FIG. 2, one of those MATCH signals is shown as going true during clock pulse P(1) at time $t_1$. Consequently, a branch prediction code BPC is read from the register file 20 and sent to computer 30. This occurs during clock pulse P(1) at time $t_2$.

Thereafter, at the start of the next clock pulse P(2) computer 30 executes an arithmetic instruction. To indicate that there is no new conditional branch instruction address for the content addressable memory 10 to search on, computer 10 makes the EN signal go false. In response, the content addressable memory 10 simply waits for the next clock pulse.

At the start of the next clock pulse P(3), computer 10 again raises the enable signal EN and sends another conditional branch instruction address SA(2) to the input terminals 10b of the content addressable memory 10. In response, the content addressable memory 10 performs a search operation on the SA(2) address. This search operation is completed at time $t_1$ of clock pulse P(3); and as FIG. 2 shows, it results in none of the MATCH signals going true.

Since no HIT occurs, a write cycle needs to be performed during which a register in the content addressable memory 10 is written with the new SA(2) address, and a corresponding register in the register file 20 needs to be written with a branch prediction code. However, by the time that all of the MATCH signals from the search operation go false, clock pulse P(3) is nearly complete. Consequently, the remainder of clock pulse P(3) does not provide enough time in which the above described write operation can be performed.

To overcome this problem, the content addressable memory 10 simultaneously performs during clock pulse P(4) both the write operation on the search address SA(2) and a search operation on the next search address SA(3). What circuitry is used to perform this simultaneous search-write operation on two different addresses within a single clock pulse will be described shortly in conjunction with FIGS. 4 and 5. Here, the important point is that this unique capability of the content addressable memory 10 enables computer 30 to proceed at the start of clock pulse P(4) by initiating a search on the next conditional branch instruction address SA(3). No extra clock cycle is required to write search address SA(2) into the content addressable memory 10, and the result of the search operation on the SA(3) address is available at time $t_1$ in clock pulse P(4).

By comparison, if a prior art content addressable memory such as those described in the background portion of this application is used in place of our content addressable memory 10, then an extra clock cycle will be required to perform the write operation. This is illustrated in the timing diagram of FIG. 4. There, during the first three clock pulses, the prior art content addressable memory performs the same search, null, and search operations as our content addressable memory 10. However, during clock pulse P(4), computer 30 must continue to send the search address in SA(2) order for the prior art content addressable memory to be able to perform just the write operation. Not until clock pulse P(5) can computer 30 send the next search address SA(3) and initiate another search.

Figure 4:
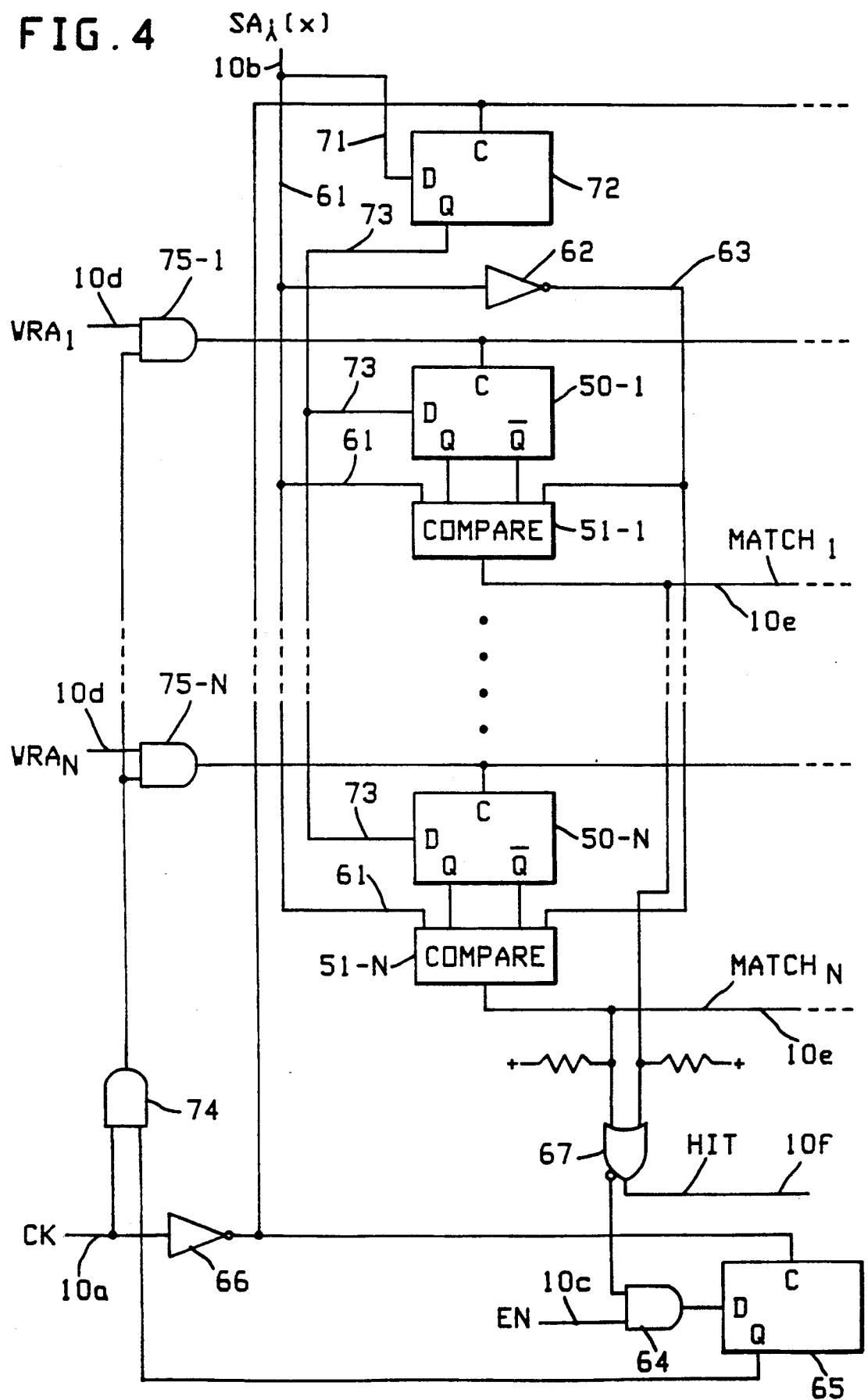
FIG. 4 is a detailed logic diagram of the content addressable memory in FIG. 1; and, FIG. 5 is a detailed circuit diagram of the major logic components in FIG. 4.

Turning now to FIG. 4, it shows a detailed logic diagram of the internal make up of the content addressable memory 10. In FIG. 4, reference numeral 50-1 indicates one flip-flop of the first address register of the content addressable memory 10, and reference numeral 50-N indicates one flip-flop of the Nth address register. Flip-flops 50-1 and 50-N are repeated for each bit in the search address SA(x); and, this is indicated by the horizontal sets of dots on the right side of FIG. 4. Similar flip-flops also exist in the content addressable memory 10 for each of the address registers which lie between the first and Nth address registers; and, this is indicated by the vertical sets of dots in FIG. 4.

Also in FIG. 4, reference numeral 51-1 indicates a compare circuit for flip-flop 50-1, and reference numeral 51-N indicates a compare circuit for flip-flop 50-N. These compare circuits are repeated for each address register flip-flop in the content addressable memory 10.

FIG. 4 also shows the previously described input terminals 10a–10d and the previously described output terminals 10e–10f. Input terminal 10b carries a signal $SA_i(x)$ which is the ith bit of the search address SA(x). In the complete content addressable memory 10, a separate input terminal 10b is provided for each bit in the search address SA(x). Likewise, a separate address input terminal 10d is provided for each of the N address registers. In FIG. 4, the first input terminal 10d receives a write address signal $WRA_1$, and the last input terminal receives a write address signal $WRA_N$.

In operation, at the start of a clock pulse, the search address SA(x) is passed from the input terminals 10b to the compare circuits via a bus, one bit of which is indicated by reference numerals 61, 62, and 63. Item 61 is a conductor which carries search address bit $SA_i(x)$ from one input terminal 10b to an input of the compare circuits 51-1 thru 51-N; item 62 is an inverter which inverts the address bit on conductor 61; and item 63 is a conductor which carries the inverted address bit from inverter 62 to a second input on the compare circuits 51-1 thru 51-N.

Each of the compare circuits 51-1 thru 51-N compares the bit which it receives on the conductors 61 and 63 to the bit in the flip-flop to which it is coupled. If all of the bits of the search address SA(x) are the same as corresponding bits of the first address register, then the $MATCH_1$ signal goes true; otherwise it goes false. Similarly, if all of the bits of the search address are the same as corresponding bits of the Nth address register, then the $MATCH_N$ signal goes true; otherwise it goes false.

All of the MATCH signals are OR'd together via a NOR gate 67 to form the HIT signal on output terminal 10f. Also, the HIT-NOT signal is logically ANDed with the enable signal EN via an AND gate 64; and, the result from that AND gate is clocked into a flip-flop 65. An inverter 66 generates the clock signal for flip-flop 65 as the inverse of the CK signal. Consequently, flip-flop 65 gets loaded with the output signal from AND gate 64 when the CK signal is low. Flip-flop 65 thus gets set at the end of a clock pulse if at that time instant, the enable signal EN is true and no HIT occurred. Otherwise, flip-flop 65 gets reset at the end of a clock pulse.

When flip-flop 65 gets set, it indicates that the content addressable memory needs to be written with the search address SA(x). At the same time however, a new search address SA(x+1) can be presented by computer 30 to the content addressable memory's input terminals 10b. To overcome this problem, the content addressable memory 10 includes a second bus, one bit of which is indicated by reference numerals 71, 72, and 73. Item 71 is a conductor which carries a bit of the search address from one input terminal 10b to a flip-flop 72 of a temporary storage register; and item 73 is a conductor which carries a bit from flip-flop 72 to all of the address register flip-flops 50-1 thru 50-N. All of the items 71, 72, and 73 are repeated for each bit in the search address SA(x).

Each search address SA(x) is written into the temporary storage register flip-flops 72 while the clock signal CK is low. Thus, the computer 30 can present the next search address SA(x+1) on the input terminals 10b when the clock signal CK goes high without disturbing the search address SA(x) in the flip-flops 72. Also when the clock signal CK goes high, the search address SA(x) in the flip-flops 72 can be transferred to one of the "N" address registers in the content addressable memory. This writing of an address register is conditional, and it occurs only if flip-flop 65 is set. When that flip-flop is set, the particular address register that gets written is selected by AND gates -74 and 75-1 thru 75-N.

Figure 5:
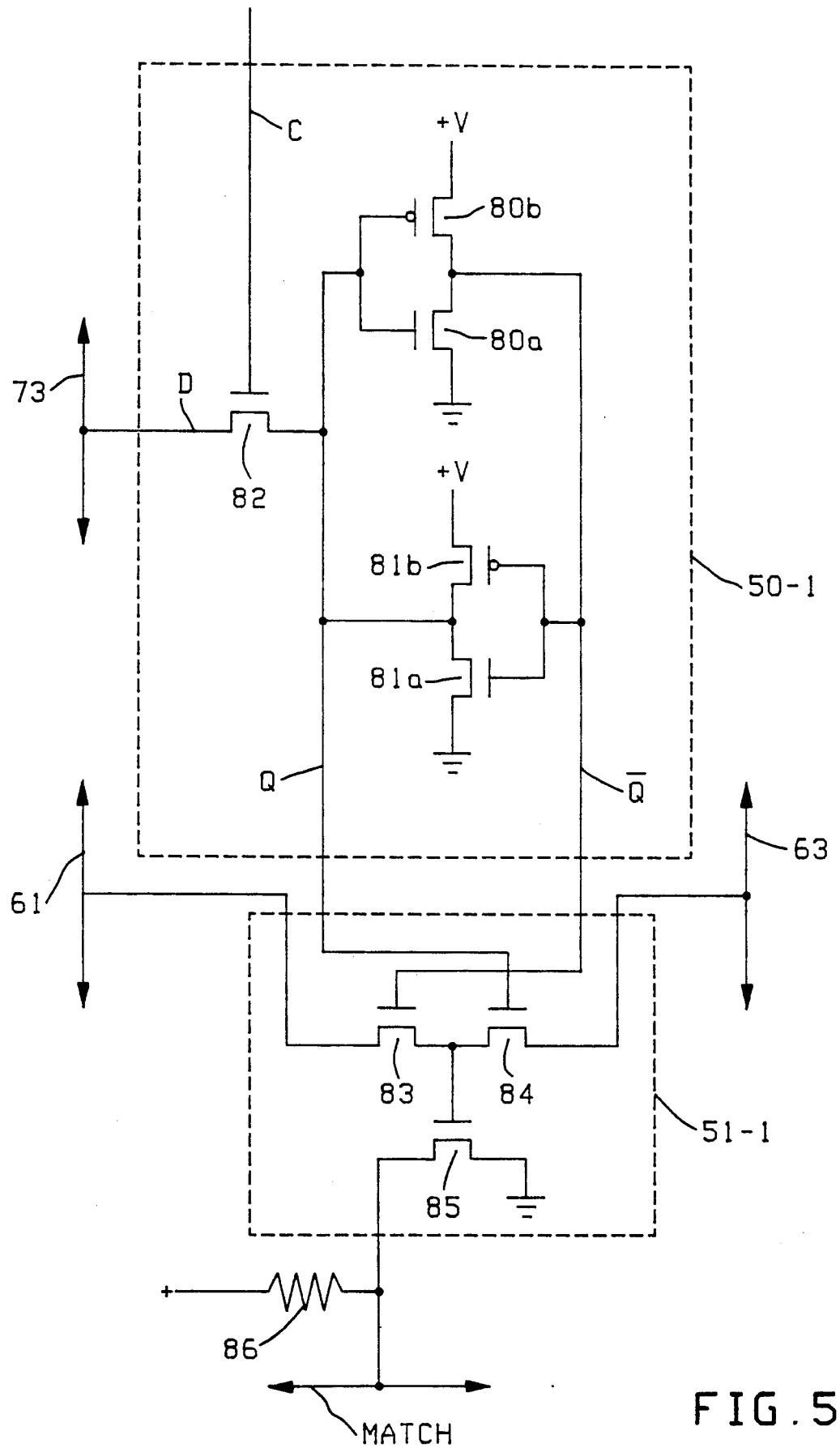

Considering next FIG. 5, it shows the details of how one of the flip-flops 50-1 and its compare circuit 51-1 are constructed of field-effect transistors. All of the other flip-flops and compare circuits in FIG. 4 are constructed in the same fashion. In FIG. 5, N-channel transistors are indicated by reference numerals 80a, 81a, 82, 83, 84, and 85; and P-channel transistors are indicated by reference numerals 80b and 81b. Transistors 80a and 80b form one inverter; transistors 81a and 81b form another inverter; and those two inverters are cross coupled to form flip-flop 51-1 having Q and Q-NOT outputs as shown. A data input D and a clock input C to flip-flop 51-1 is provided by transistor 82 as shown.

Transistors 83, 84, and 85 form the compare circuit 51-1. Input signals to the compare circuit come from the Q and Q-NOT output terminals of flip-flop 50-1, and from conductors 61 and 63. One mismatch which is defected by transistor 83 is that the search address bit on conductor 61 is true and the Q-NOT output of flip-flop 50-1 is true. Another mismatch which is detected by transistor 84 is that the search address bit complement on conductor 63 is true and the Q output of flip-flop 50-1 is true. Those two conditions turn on transistor 85 which forces the MATCH signal low. Otherwise, transistor 85 will be off and the MATCH signal will be forced high by a pull-up resistor 86.

A preferred embodiment of the invention has now been described in detail. In addition however, many changes and modifications can be made to the preferred embodiment without departing from the nature and spirit of the invention. For example, the search addresses SA(x) that are sent to the content addressable memory and the compare addresses that are stored in the address registers are not limited to being addresses of conditional branch instructions. In general, the search addresses and compare addresses can be any type of digital data on which comparisons need to be made as part of some high level operation. Accordingly, it is to be understood that the invention is not limited to just the preferred embodiment but is defined by the appended claims.

What is claimed is:

1. An improved content addressable memory of the type which includes, a) a clock input terminal for receiving successive clock pulses, b) search input terminals for sequentially receiving search addresses in synchronization with said clock pulses, c) a plurality of address registers which selectively store said search addresses and, d) compare circuits respectively coupled to each of said registers, that generate MATCH signals which indicate when a search address on said search input terminals is the same as an address in said address registers; wherein the improvement comprises:
   a first address circuit, coupled to said search input terminals, which transfers said search addresses from said search input terminals to said plurality of compare circuits;
   a second address circuit, coupled to said search input terminals, which operates in parallel with said first address circuit and sends said search addresses from said search input terminals to said plurality of address registers with a predetermined time delay; and,
   a control circuit, that is coupled to said clock input terminal, said plurality of address registers and said compare circuits, which during a single clock cycle a) conditionally provides write signals that write enable a delayed search address from said second address circuit to be written into a selectable one of said address registers, and b) receives said MATCH signals, as they are generated by said compare circuits, which compares said delayed search address in said selectable one of said address registers with another search address from said first address circuit, and stores a control signal representative of the MATCH signals.

2. A content addressable memory according to claim 1 wherein said second address circuit includes a temporary storage register, coupled between said search input terminals and said plurality of address registers, which temporarily stores every one of said search addresses on said search input terminals to obtain said time delay.

3. A content addressable memory according to claim 2 wherein said temporary storage register stores said search addresses late in one clock cycle, and said control circuit conditionally provides said write signals early in the next clock cycle.

4. A content addressable memory according to claim 3 wherein said control circuit conditionally provides said write signals during said next clock cycle only if one of said match signals indicate a comparison during said one clock cycle.

5. A content addressable memory according to claim 4 wherein said control circuit is constructed entirely of field effect transistors on a single integrated circuit chip.

6. A content addressable memory according to claim 1 wherein said second address circuit includes a temporary storage register, coupled between said search input terminals and said plurality of address registers, which unconditionally stores each of said search addresses on said search input terminals, and said write signals from said control circuit conditionally enables the writing of said stored search addresses into said plurality of address registers.

7. A content addressable memory according to claim 1 wherein said write signals from said control circuit conditionally enables the writing of said search address into one of said address registers early in said single clock cycle and stores said control signal representative of the MATCH signal late in the same clock cycle.

8. A content addressable memory according to claim 1 wherein said write signals form said control circuit conditionally enables the writing of said search address into said selectable address register during said single clock cycle only if none of said match signals indicate a comparison during the immediately preceding clock cycle.

* * * * *